(12) United States Patent
Grodzki et al.

(10) Patent No.: US 10,203,384 B2
(45) Date of Patent: Feb. 12, 2019

(54) METHOD AND MAGNETIC RESONANCE APPARATUS FOR ACCELERATE ACQUISITION OF MAGNETIC RESONANCE DATA OF AN EXAMINATION OBJECT BY UNDERSAMPLING THE ACQUIRED MAGNETIC RESONANCE DATA

(71) Applicant: Siemens Aktiengesellschaft, Munich (DE)

(72) Inventors: David Grodzki, Erlangen (DE); Bjoern Heismann, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 1029 days.

(21) Appl. No.: 14/627,147

(22) Filed: Feb. 20, 2015

(65) Prior Publication Data
US 2015/0234023 A1    Aug. 20, 2015

(30) Foreign Application Priority Data

Feb. 20, 2014  (DE) .................. 10 2014 203 067

(51) Int. Cl.
| | | |
|---|---|---|
| G01R 33/48 | (2006.01) | |
| G01R 33/54 | (2006.01) | |
| G01R 33/561 | (2006.01) | |
| G01R 33/563 | (2006.01) | |

(52) U.S. Cl.
CPC ......... *G01R 33/482* (2013.01); *G01R 33/546* (2013.01); *G01R 33/5611* (2013.01); *G01R 33/5635* (2013.01)

(58) Field of Classification Search
CPC ............... G01R 33/482; G01R 33/546; G01R 33/5611; G01R 33/5635; G01R 33/561; G01R 33/4818
See application file for complete search history.

(56) References Cited

U.S. PATENT DOCUMENTS

| | | | | |
|---|---|---|---|---|
| 2001/0038284 A1* | 11/2001 | Hahn | ..................... | G01R 33/54 324/307 |
| 2010/0026294 A1 | 2/2010 | Lustig et al. | | |
| 2012/0169338 A1* | 7/2012 | King | .................. | G01R 33/5611 324/309 |
| 2012/0313641 A1* | 12/2012 | Labadie | ............. | G01R 33/4818 324/309 |

(Continued)

OTHER PUBLICATIONS

Lustig et al. "Sparse MRI: The Application of Compressed Sensing for Rapid MR Imaging"; in Magnetic Resonance in Medicine; vol. 58; pp. 1182-1195; (2007).

(Continued)

*Primary Examiner* — Jay Patidar
(74) *Attorney, Agent, or Firm* — Schiff Hardin LLP

(57) ABSTRACT

In a method and apparatus for recording magnetic resonance data of an object to be examined, two-dimensional k-space is scanned along lines extending in a readout direction within an acquisition trajectory. Undersampling is carried out along at least some of the lines and, during an acquisition section proceeding through the entirety of k-space in the readout direction, multiple jumps occur as a result of gradient pulses in the phase coding direction perpendicular to the readout direction. These jumps can occur between adjacent lines.

22 Claims, 3 Drawing Sheets

(56) References Cited

U.S. PATENT DOCUMENTS

2015/0115960 A1* 4/2015 Grodzki ................ G01R 33/34
324/309

OTHER PUBLICATIONS

Wang et al. "Pseudo 2D Random Sampling for Compressed Sensing MRI"; IEEE Eng. MEd. Biol.; pp. 2672-2675; (2009).
USMANet al. "Optimized Sampling Patterns for Practical Compressed MRI"; SAMPTA; pp. https://hal.archives-ouvertes.fr/hal-00453565 ( 2009).
Lustig et al. "Rapid MR Imaging with "Compressed Sensing" and Randomly Under-Sampled 3DFT Trajectories"; Proc. Int. Soc. Mag. Reson. Med. vol. 14; pp. 695;(2006).

* cited by examiner

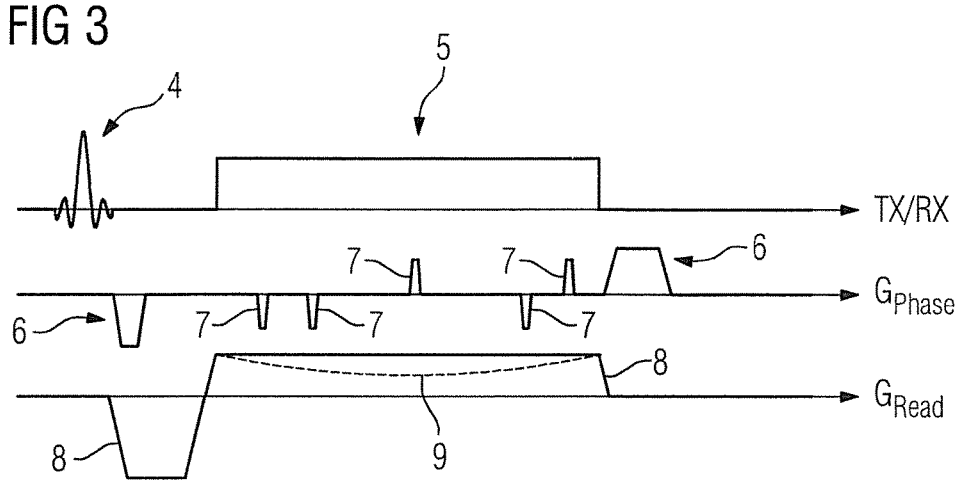
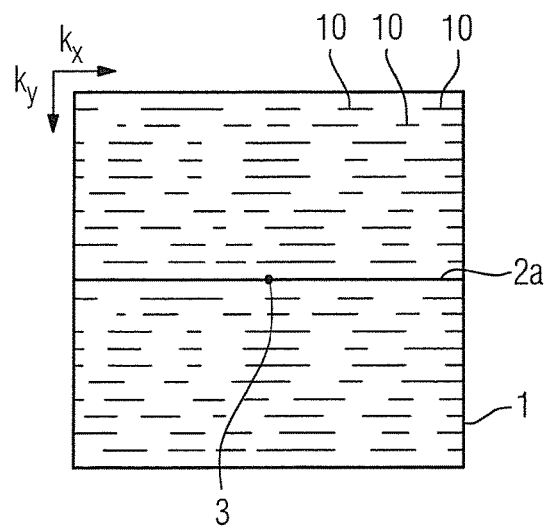

METHOD AND MAGNETIC RESONANCE APPARATUS FOR ACCELERATE ACQUISITION OF MAGNETIC RESONANCE DATA OF AN EXAMINATION OBJECT BY UNDERSAMPLING THE ACQUIRED MAGNETIC RESONANCE DATA

BACKGROUND OF THE INVENTION

Field of the Invention

The invention relates to a method for acquiring magnetic resonance data of an object to be examined, of the type wherein two-dimensional k-space is scanned along lines extending in a readout direction within a data entry trajectory. The invention further relates to a magnetic resonance apparatus for implementing such a method.

Description of the Prior Art

Magnetic resonance imaging is widely known and has become an established modality in medical examinations. In magnetic resonance imaging, nuclear spins in an object to be examined are aligned by means of a basic magnetic field, the so-called B0 field, and are excited (deflected out of the aforementioned alignment) by radio-frequency pulses, i.e. a field that changes rapidly over time, the so-called B1 field. During the relaxation (return to alignment) of the spins, magnetic resonance signals, which are detected by a radio-frequency coil arrangement, are produced. Data corresponding to the detected magnetic resonance signals are entered into k-space, and are transformed by a Fourier transform into the image domain in order to obtain a magnetic resonance image. In order to fill k-space with the data, it is known to enter the data at different points along a k-space trajectory or recording trajectory that is produced by gradient pulses. This process, i.e. the measurement of a complete recording trajectory in the k-space, requires a certain length of time.

Acceleration of the acquisition of magnetic resonance data is an important aspect of clinical magnetic resonance imaging. For the user, the acquisition speed not only considerably influences patient throughput in the magnetic resonance apparatus, but also defines how long an individual patient has to remain in the magnetic resonance apparatus as the object to be examined. Thus, the saving in terms of throughput and the differentiation in terms of patient comfort are equally relevant.

In this case, proposals have been made as to how magnetic resonance imaging may be accelerated. Parallel imaging is an example whereby different regions of the object to be examined are excited simultaneously and read out. Also, many different proposals have been made that relate to the reconstruction of an image from a k-space data set that is undersampled, i.e., not every possible data entry point in k-space has been filled with a data entry.

A specific form of undersampling of the k-space is known by the term "Compressed Sensing" (CS), see for example the article by Michael Lustig et al., "Sparse MRI: The Application of Compressed Sensing for Rapid MR Imaging", Magnetic Resonance in Medicine 58:1182-1195 (2007). In this case, an iterative reconstruction is defined by making assumptions about the result space of the imaging, requiring an incomplete, pseudo-randomized scanning of the k-space, wherein the term "Compressed Sensing" in the narrower sense denotes the application of the L1 norm in iterative reconstruction. The practical embodiment of "Compressed Sensing" proposes that individual recording sections, for example lines in the k-space, are randomly omitted, wherein in three-dimensional measurements it is possible to calculate in a simple manner the missing information by iterative reconstruction so that artifact-free images are produced. Two-dimensional measurements are generally carried out along lines in the readout direction in the k-space. The random omission of lines in this case, as it was possible to show, does not lead to artifact-free image results as the undersampling of the k-space does not occur sufficiently randomly. An application of "Compressed Sensing" in spatial two-dimensional imaging is, therefore, only possible in real-time dynamic processes such as angiographs, or recordings of movement processes, as then the time is able to be used as the third dimension.

In summary, therefore, the known methods provide solutions for real-time dynamic processes and for three-dimensional magnetic resonance sequences. However, these solutions, in particular "Compressed Sensing", are not able to be used for conventional static two-dimensional magnetic resonance imaging which represents the majority of acquisition processes.

SUMMARY OF THE INVENTION

An object of the invention is to accelerate the measuring time by undersampling, even for two-dimensional Cartesian scanning of k-space.

This object is achieved according to the invention by a method of the type initially cited, but wherein undersampling is carried out along at least one part of the lines, and wherein during a portion of the data acquisition that passes through the entirety of k-space in the readout direction, multiple jumps occur as a result of gradient pulses in the phase coding direction perpendicular to the readout direction. These jumps preferably occur between adjacent lines in k-space.

The invention is based, therefore, on conventional Cartesian two-dimensional scanning of k-space, as it uses many sequences, for example the gradient echo sequence. In this case, k-space is generally read out in lines in the readout direction, wherein a specific number of these lines follow one another in the phase coding direction. In accordance with the invention, therefore, instead of a complete omission of lines, which would lead to artifact-affected results, the undersampling is implemented so that the individual lines are only partially scanned. This means that in the method according to the invention, no lines remain completely unscanned in k-space, but at least some of the lines in k-space are scanned (filled) only partially, i.e. not filled at every available data entry point thereof. To this end, in order not to deviate from the conventional acquisition sections (repetitions) that are defined by the application of a read-out gradient and during which k-space is completely passed through once in the readout direction, a practical method is not to remain on a single line in k-space, but to jump between lines during such an acquisition section. This reduces the measuring time because fewer acquisition sections are required in k-space than lines.

Possibilities of achieving this are exceptionally short gradient pulses in the phase coding direction which are generally denoted as "blips". Such blips which, for example, may have a time duration of 100-200 µs and may last for example 1-5 ms during the acquisition time window of the acquisition section, may be used both to jump to a directly adjacent line, which is preferred, or alternatively permit a jump to a line spaced farther away. This means that by the use of the short gradient pulse at least two lines are always acquired (i.e., has data entered therein) in k-space, but each such visited line is only partially filled with data during an acquisition section. This results in the desired undersampling so that, in particular, fewer acquisition sections are used in k-space than lines, although each line to be scanned in k-space is visited at least once.

Therefore, during an acquisition time window (read-out process), which is defined by the duration of an applied gradient in the readout direction, the recently scanned k-space line is able to be altered by at least one line, in particular in a random direction, in particular at random intervals. To this end, short gradient pulses, so-called blips, are activated in the phase coding direction, which alter the phase coding direction k-space value within a very short time. Thus, a pseudo-randomized undersampling of two-dimensional k-space is achieved. In this manner, an acceleration of the measuring time may be obtained by an acceleration factor of two to four or more, while the bandwidth, echo times, repetition times and the like are able to remain unaltered, so that the resulting magnetic resonance images exhibit any degradation of contrast due to the undersampling. It is generally assumed that undersampling in principle leads to losses in the signal-to-noise ratio, but due to the extremely high signal-to-noise ratio in the vast majority of examinations such losses are barely noticeable.

It is essential for obtaining good artifact-free image quality for the undersampling to take place as randomly as possible, and is thus "pseudo-randomized". In practice, therefore, it may be said that the acquisition trajectory is selected such that, at least in a local neighborhood of k-space, a distribution of the scanned points in k-space is provided that exceeds a predetermined uniform distribution level. In other words, the undersampling is distributed as uniformly as possible in the adjacent k-space lines, at least in the regions of k-space to be acquired that is subjected to undersampling, about which further details are provided below, since within the scope of the present invention, a region surrounding the k-space center is omitted from the undersampling. The problem with known methods, such as for example "Compressed Sensing", is that this principle of uniform distribution, i.e. the pseudo-randomization, was no longer fulfilled when omitting entire lines of the k-space, so that an artifact-free reconstruction of the missing k-space lines was not possible. The present invention, however, permits a random undersampling of k-space by randomly jumping between at least two k-space lines during a read-out process (acquisition section). Thus, a distribution of the points acquired in k-space is achieved so that statistically a uniform distribution, which is accurate as possible, is provided.

This randomness of the undersampling of k-space should be ensured before using a specific acquisition trajectory, and thus in an embodiment of the invention, before the acquisition of the magnetic resonance data, the acquisition trajectory in k-space containing the jumps is initially determined randomly, the acquisition trajectory is tested for at least one distribution criterion and only when the acquisition trajectory fulfills the at least one distribution criterion is this acquisition trajectory used for the acquisition, otherwise a new acquisition trajectory is determined. The acquisition trajectory containing the jumps is thus randomly generated and it is immediately tested whether it is actually suitable for scanning k-space, so that an artifact-free reconstruction of magnetic resonance images is also possible in a two-dimensional case. This takes place by a distribution criterion being used, the distribution criterion serving for evaluation of the distribution of the points in k-space and requiring, in order to be fulfilled, that an at least localized uniform distribution will occur, and the acquisition trajectory is only actually used when this criterion is fulfilled.

In an expedient practical embodiment, a homogeneity criterion is used as the distribution criterion, this homogeneity criterion testing a predetermined density distribution of the scanned points in the k-space depending on the degree of undersampling. Such a homogeneity criterion thus is intended to test whether a sufficient uniform distribution (homogeneity) is to be anticipated by a random process that is being tested.

In this case, it is possible in principle to aim for a distribution of the read-out points in k-space that, as a whole, is as homogenous as possible, wherein expedient embodiments take into account the recognition that the radial two-dimensional density of k-space scanning should give greater emphasis to the center of k-space, because as the most important signal components are present there, and thus also the signal-to-noise ratio of the image is essentially determined by those signal components. Therefore, in an embodiment of the invention, a density distribution describing a density reducing radially from the k-space center is used as the density distribution. An example is a density distribution reducing according to one divided by a polynomial of the distance from the k-space center. Another example is a density distribution describing a density dropping from a line containing the k-space center in the phase coding direction, in particular reducing according to one divided by a polynomial of the distance from the k-space center in the phase coding direction. In the second example, uniform and therefore constant density distribution may be provided in the readout direction. This second example is expedient primarily if the line containing the center of k-space, and/or the next adjacent line, is in any case to be read out completely. Then the density may drop more sharply in the boundary regions that are less relevant to the signal-to-noise ratio, so that here a greater saving of measuring time is provided by the reduced density. Naturally, the acquisition trajectory may also be selected such that, as a whole, a density is provided for the points of k-space to be read out that drops radially from the center of k-space, wherein a dependency according to $1/r^n$ has proved expedient, so that the density distribution is therefore one divided by the corresponding distance r to the power of n, wherein n is expediently selected from a range from 1 to 3. This ensures a high scanning density in the region around the k-space center but toward the periphery provides further possibilities for saving measuring time.

In this case it should be mentioned once again that the density distribution should be selected to be dependent on the desired degree of undersampling, so that this is also able to be carried out.

For practical testing of the homogeneity criterion, in an embodiment of the invention k-space is subdivided into multiple segments, the densities thereof being calculated and being compared with at least one reference value determined from the density distribution, wherein a predetermined deviation is permitted. In this case, the predetermined permitted deviation, for example, may be 10 to 30% but may also be dependent on the desired degree of undersampling, since minor fluctuations may be permitted in the case of a high level of undersampling. It is, therefore, expedient to subdivide k-space into segments, for example 9, 16 or 25 segments, for which anticipated values for the scanning density may be derived and tested from the density distribution. If the acquisition trajectory (k-space trajectory) were now randomly generated, such that in spite of the randomness the desired density distribution were not achieved and thus the risk of artifacts were present, a new acquisition trajectory could be randomly generated and tested again.

Additionally or alternatively to the homogeneity criterion, a neighborhood criterion can be used as a distribution criterion that compares the number of points to be scanned on adjacent lines in the k-space at least for part of the lines. By such a neighborhood criterion, therefore, it may be established whether immediately adjacent lines are also scanned to the same degree, which is desirable in the sense of a uniform distribution of the points to be scanned in k-space. In this case it may be provided in practice that for fulfilling the neighborhood criterion the number of points to be scanned on adjacent lines to be tested are only allowed to deviate from one another by a predetermined proportion, in particular by a proportion in the interval of 10 to 30% and/or a proportion dependent on the degree of undersampling. Also in this case, with greater degrees of undersampling a lower tolerance may naturally be provided.

In another embodiment of the invention, the acquisition trajectory is determined by a random walk algorithm. This is a known algorithm that is particularly suitable for generating random acquisition trajectories of the type according to the invention. Therefore, the direction and the time of the k-space line jumps are determined using a random walk process. If jumps over several lines in k-space are permitted, the width of the jump may also be part of the random walk process. The parameterization of the random walk process in this case may be carried out such that the desired density distribution of the scanning density in k-space is also adopted already, for example by the probabilities of jumps and/or time spent on lines and the probabilities thereof being correspondingly adapted to the targeted density distribution in k-space.

In order to achieve a sufficient degree of randomization and uniformly distributed scanning, according to the invention at least four jumps occur along each recording section. It has thus been shown that it is possible to achieve in the most rapid manner that sufficient components and sufficiently spaced apart components of all lines in k-space are actually scanned.

In another embodiment of the present invention provides that a line containing the center of k-space or a line closest thereto is completely recorded. In this manner, it is ensured that in the region of the center of k-space that primarily determines the contrast and thus the signal-to-noise ratio, sufficient data is present in any case and the image quality is maintained. This may also naturally be applied to lines adjacent to the line containing the center of k-space, so that for example it is possible to completely acquire three or five central lines of k-space and to refer the randomized scanning only to further outer regions of k-space. In another embodiment of the method according to the invention, the random determination of the acquisition trajectory takes place such that specific line portions containing the center of k-space or adjacent thereto are forcibly passed through in order to ensure in this manner a sufficient number of magnetic resonance data from the k-space center under forced conditions.

During chronologically successive acquisition of magnetic resonance data sets, a further undersampling can take place by omitting random lines in the individual magnetic resonance data sets, and during the reconstruction of images from the magnetic resonance data, an interpolation of the missing lines is carried out, also taking into consideration the time dimension as a third dimension. It is therefore possible to combine the procedure according to the invention for further acceleration of the measurement process with the cited "Compressed Sensing" method if a dynamic process is to be acquired and therefore the magnetic resonance data disintegrate into several magnetic resonance data sets assigned to different time periods, which adds the time to the total data set as a third dimension, so that in turn the use of "Compressed Sensing" is permitted. In this case, expediently the lines to be omitted before determining the acquisition trajectory for each magnetic resonance data set, each line covering k-space to be acquired, are already determined and the acquisition trajectories for the magnetic resonance data sets are then generated based only on the lines to be acquired, for example as has been shown, within the context of a random walk process. An example of such real-time dynamic processes are angiographs.

The method according to the invention naturally may also be combined with other existing image acceleration methods, for example parallel imaging. A further acceleration may also be achieved thereby.

Solely by means of the method according to the invention as described, a measuring time acceleration may be implemented by an acceleration factor in the range of 2 to 4, but larger acceleration factors are possible within the scope of the present invention, so a greater level of undersampling is able to be carried out if, for example, overview measurements, for example localizers, are to be acquired or rapid body imaging with a computed tomography-type image quality is to be achieved. In these cases, i.e. with a high level of undersampling, the effects of noise or blurring might occur, but these are less disruptive in overview images and/or CT-type magnetic resonance data.

In another embodiment of the invention, a read-out gradient pulse used during an acquisition section is selected for reducing the bandwidth in a region closest to the k-space center, in particular the gradient field strength is reduced for the region closest to the k-space center. Such methods are known in principle and may, for example, involve a continuous alteration of the gradient strength of the read-out gradients such that in the k-space center a reduced gradient strength, and thus a reduced bandwidth, is provided that also improves the signal-to-noise ratio.

Within the scope of the present invention it is also possible to exploit further magnetic resonance data measured during the jumps between the lines, for example, by this magnetic resonance data being back-calculated to the grid in k-space to be scanned. Therefore, when magnetic resonance data are obtained, even during a jump which for example may require 100 to 200 µs, it is possible to make further use of this data, even when the data are not on the previously defined Cartesian grid, by this data being back-calculated to the grid. This process is also denoted as "gridding".

Preferably, however, a phase difference is determined for the acquired magnetic resonance data, such as during jumps of a repeatedly measured point in k-space, and information about the movement of the object to be examined is determined therefrom. Within the scope of the present invention, it is possible that, due to the randomness of the generation of the acquisition trajectory, parts of a line in k-space are repeatedly acquired, therefore magnetic resonance data may even be present twice in lines. This does not have to be excluded if, for example, the corresponding distribution criteria are still fulfilled. Other points in k-space measured twice may occur when edges between different lines in k-space, which are produced by the jumps, intersect. A phase difference may be determined for such repeatedly measured points in k-space, which permits conclusions to be made about the movement of the object to be examined at this position. Suitable methods that make conclusions about movement processes from phase differences are known in the prior art. The movement information obtained may be used in order to carry out movement corrections to the magnetic resonance data, since the time path together with the information about the phase position contains information about a relative movement of the object to be examined.

Because the magnetic resonance data of an acquisition section, i.e. a read-out process, no longer refers to a single line in k-space, information about which lines the magnetic resonance data belongs to is naturally also forwarded to the corresponding evaluation algorithms, for example in practice to an image reconstruction unit of the magnetic resonance device. Here the correct assignment of the magnetic resonance data may be carried out on the Cartesian grid to be scanned.

In addition to the method, the present invention also concerns a magnetic resonance apparatus having a control computer configured to implement the method according to the invention. All embodiments of the method according to the invention are applicable to the magnetic resonance apparatus according to the invention, by which the aforementioned advantages are also obtained. For example, the control device can include an acquisition trajectory generating unit in which acquisition trajectories, in particular using a random walk algorithm, can be randomly determined. The control computer can also include a testing unit for testing whether the generated acquisition trajectory fulfils at least one distribution criterion, an acquisition unit that activates the remaining components of the magnetic resonance apparatus, in particular a gradient coil arrangement and a radio-frequency coil arrangement for acquiring the magnetic resonance data, taking into consideration the determined acquisition trajectory. The jumps are thus produced by short gradient pulses, so-called blips, being emitted at a specific polarity and/or jump width in k-space in the phase coding direction.

BRIEF DESCRIPTION OF THE DRAWINGS

FIG. 3 shows a magnetic resonance sequence for a recording section in the method according to the invention.

FIG. 4 shows the read-out of k-space in the method according to the invention.

DESCRIPTION OF THE PREFERRED EMBODIMENTS

Figure 1:
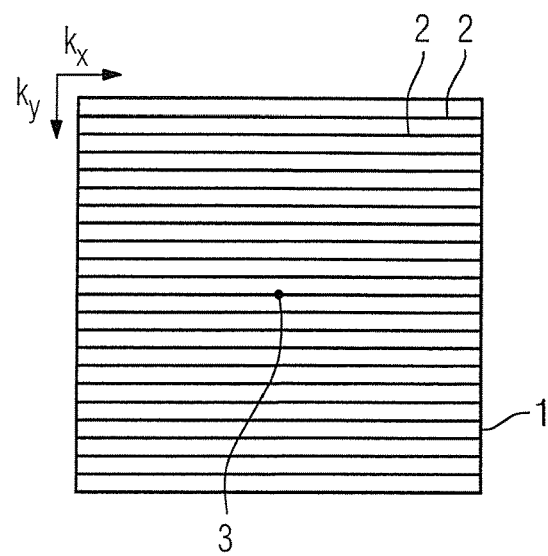
FIG. 1 shows a two-dimensional Cartesian read-out of k-space with lines in the readout direction.

The present invention relates to magnetic resonance sequences that scan k-space 1 are shown in FIG. 1. The scan takes place two-dimensionally along lines 2, which extend in the direction of the read-out gradients (readout direction) $k_x$ and follow one another at an equal distance in the direction of the phase coding gradients (phase coding direction) $k_y$. It can be seen that one of the lines contains the center 3 of k-space 1. As a practical example of a magnetic resonance sequence, a Cartesian gradient echo sequence (GRE sequence) is considered below. In this case, during a repetition of the sequence, a k-space line 2 of a desired phase coding step is scanned, which corresponds to a recording section. Therefore, if no undersampling is used, the number of acquisition sections that defines the total measuring time corresponds to the number of lines 2, and thus the required phase coding steps.

Figure 2:
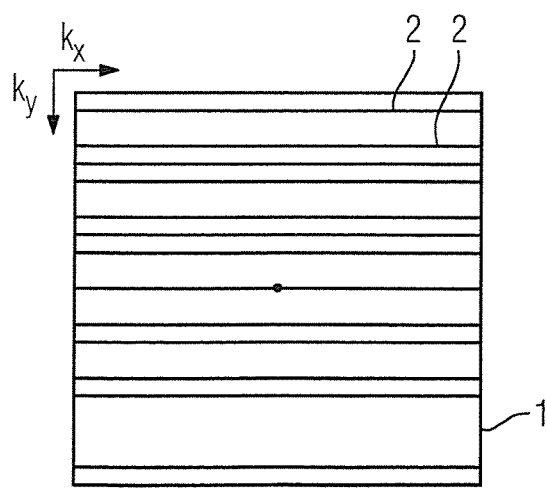
FIG. 2 shows the read-out of lines by the application of "Compressed Sensing" in the prior art.

If the "Compressed Sensing" method known from the prior art is now applied, in order to achieve undersampling, see FIG. 2, individual k-space lines 2 would be omitted randomly, so that only part of the lines 2 is measured, as shown in FIG. 2. The missing information is intended to be calculated by iterative reconstruction. This is possible in three-dimensional measurements, but in two-dimensional measurements as those considered here, the scanning of the k-space 1 by omitting individual lines 2 is not sufficiently random to generate artifact-free images. In other words, the magnetic resonance data obtained in k-space 1 are not sufficiently uniformly distributed.

The present invention now provides for reducing the acquisition sections, i.e. phase coding steps, in which the entirety of k-space 1 is proceeded through in the readout direction $k_x$, while nevertheless scanning points in all lines 2 of k-space 1, so that a distribution that is as random as possible is present, which corresponds to a desired scanning density distribution in k-space 1, about which further details are provided below. This is achieved during an acquisition section by jumping between at least two k-space lines 2. The corresponding implementation shows the exemplary GRE sequence for a read-out section according to FIG. 3, wherein in the uppermost line the radio-frequency excitation signal 4 and the read-out window 5 denoted by ADC are shown by TX/RX, in the second line the gradient pulses 6, 7 in the phase coding direction and in the third line the gradient pulses 8 in the readout direction which may remain substantially unaltered.

As can be seen, the phase coding gradient pulses 6 correspond to the usual gradient pulses for the phase coding direction in gradient echo sequences while the brief gradient pulses 7 in the method according to the invention are added. The gradient pulses 7 are so-called blips that permit jumping by exactly one line 2 in k-space 1, wherein the polarity of the gradient pulses 7 determines the direction. The example of FIG. 3, therefore, illustrates initially jumping down one line 2 twice in the k-space 1, then one line 2 above, one line 2 below and again one line 2 above. This permits during a single recording section magnetic resonance data of several lines 2 to be obtained without a line 2 being completely acquired. The time, the polarity and optionally also the jump width of the gradient pulses 7 (blips) is in this case randomly selected in the exemplary embodiment according to FIG. 6 using a random walk process. The duration of a gradient pulse 7 in this case may be between 100 to 200 µs, the duration of the read-out time window 5 being 1 to 4 ms.

As mentioned, the gradient pulses 8 in the readout direction may remain unchanged, wherein it may also be provided as indicated by the path 9 in dashed lines, however, to alter the gradient strength of the gradient pulse 8 active during the read-out time window 5, in order to achieve a band width alteration, in particular a narrower band width, in the k-space center.

If several such acquisition sections that have been randomly determined are now combined, and the number thereof being lower than the number of lines 2 in k-space 1 to be scanned, an undersampling results, which leads to a saving of measuring time, since fewer recording sections are required. The randomness of the jumps produced by the gradient pulses 7, as a whole also results in a sufficiently random distribution in order to be able to interpolate reliably the missing information, in particular within the context of an iterative reconstruction. In the present case, at least four jumps per recording section are provided therefor.

The boundary conditions for the random generation of the k-space trajectory (acquisition trajectory) which is characterized by the jumps between the lines 2, may be selected so that a desired density distribution of the scanning in the k-space 1 results as far as possible. Preferably in this case it is ensured that in the region of the k-space center 3 a greater scanning density is present than at a distance from the k-space center 3. A possible resulting distribution of portions 10 of the lines 2 in k-space 1 to be scanned is shown in FIG. 4. It is seen here that the line 2a containing the k-space center 3 is still completely scanned since the central region of the k-space 1 primarily determines the contrast and thus the signal-to-noise ratio. Also the lines adjacent to the central line 2a are visibly still scanned at a higher density, so that in particular a density distribution is produced dropping from the line 2a containing the k-space center 3 in the phase coding direction which, for example, may be defined by $1/r^n$, wherein n may be selected in the range of 1 to 3.

Figure 5:
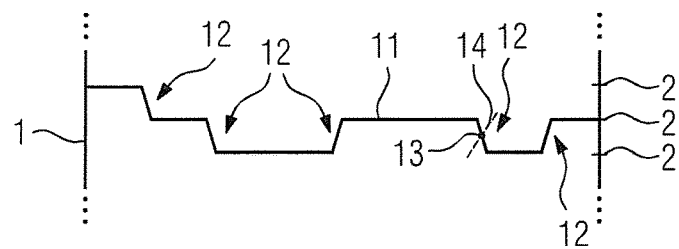
FIG. 5 shows the proportion of the acquisition trajectory assigned to the sequence in FIG. 3.

FIG. 5 shows in more detail the acquisition trajectory 11 assigned to the sequence shown in FIG. 3 of a recording section, therefore the proportion of total recording trajectory in k-space 1. This relates in the present case to three lines 2 of the k-space 1 indicated at least on the right. The jumps 12 between different lines produced by the gradient pulses 7 may be clearly seen.

During these jumps 12, magnetic resonance data may also be recorded, which may be incorporated in the magnetic resonance data used for reconstructing images by back-calculating to the Cartesian grid to be scanned, but it may also be evaluated with regard to a movement correction. Within the scope of the invention at different, in particular randomly distributed, points of k-space, it may occur that the acquisition trajectory 11 has points of intersection, which for example is illustrated using the k-space point 13, which is not only detected in the acquisition section of the sequence according to FIG. 3, but also in a different acquisition section as indicated by the dashed line 14. This means magnetic resonance data are present at the point 13 at different times. If the relative phase position of the magnetic resonance data is compared, information is obtained therefrom about the movement of the object to be examined, in particular of a patient, so that when considering several such repeatedly measured points 13 in k-space 1 movement information describing the movement of the object to be examined locally at different points may be determined and the information used for movement correction. It should be noted that with random generation of the recording trajectories for the method it is also possible that points in the k-space 1, which are located on lines 2, are repeatedly measured and correspondingly may be considered with regard to movement information. This is, however, less preferable because as much as possible of k-space 1 is to be scanned by the undersampling in a manner that is distributed as uniformly as possible.

Tests have shown that, by this procedure, undersampling may be carried out with an acceleration factor of 2 to 4 relative to the measuring time without appreciable losses to the image quality, in particular artifacts, occurring. Also, the procedure described here may be used with higher acceleration factors, wherein a worsening signal-to-noise ratio has to be taken into account but this may not be a problem, for example, when making overview recordings.

The procedure described here may also be combined with other acceleration methods, for example with a chronologically successive recording of magnetic resonance data sets, in which the time forms a third dimension, by "Compressed Sensing"; combining with parallel imaging is naturally also possible.

Figure 6:
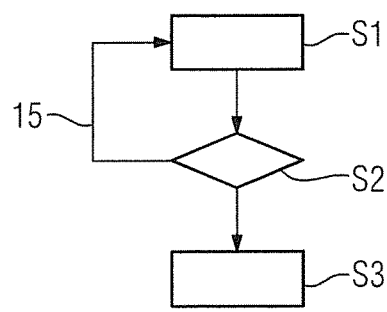
FIG. 6 is a flowchart of the method according to the invention.

FIG. 6 shows a flowchart of a practical embodiment for carrying out the method according to the invention. Here in a step S1, by using a random walk algorithm, candidates for complete total recording trajectories are determined by jumps 12 being inserted at random times in a random direction during the acquisition sections. The probabilities in this case may be adapted to a desired target density distribution so that, for example, a greater scanning density in the region of the k-space center 3 may be implemented. Also boundary conditions may be considered, for example, so that a dual scanning of points and the like is to be avoided as far as possible.

Since the random generation of recording trajectories does not ensure that said acquisition trajectories also reproduce the desired density distribution, they are tested before use in the actual data recording in step S2 for distribution criteria. In the present case two distribution criteria are used, namely firstly a homogeneity criterion, for the testing thereof the k-space 1 being subdivided into segments in which, due to the predetermined distribution of the scanning density, a specific scanning density of points is anticipated. For example, a division into nine or sixteen segments may be carried out. For each of these segments, the density produced by the acquisition trajectory is determined and compared with the scanning density determined from the predetermined density distribution. Only deviations within a specific tolerance range are accepted, wherein the tolerance range may be selected to be dependent on the degree of undersampling and namely in an interval of 10 to 30%.

The second considered distribution criterion is a neighborhood criterion which compares the number of scanned points in k-space 1 in line 2 to that in directly adjacent lines 2, wherein also individual lines, for example a completely recorded line 2a in the k-space center 3, may be taken out of consideration, in particular therefore lines in which in any case a sharply falling gradient of the scanning density is provided or a higher scanning degree is specifically targeted. The scanned points of adjacent lines 2 should not deviate too sharply from one another, wherein a tolerance range here may in turn be in the interval of 10 to 30% and also may be determined depending on the degree of undersampling.

Only when all distribution criteria are fulfilled is the acquisition trajectory used in step S3 in order to acquire the magnetic resonance data. Otherwise, see arrow 15, a further acquisition trajectory is randomly determined.

Naturally the path of the acquisition trajectory is made known to the evaluation unit/image reconstruction unit of the magnetic resonance device, so that this unit may assign the magnetic resonance data to the correct points in k-space 1. The missing information from the k-space may be determined, for example, within the context of an iterative reconstruction.

Figure 7:
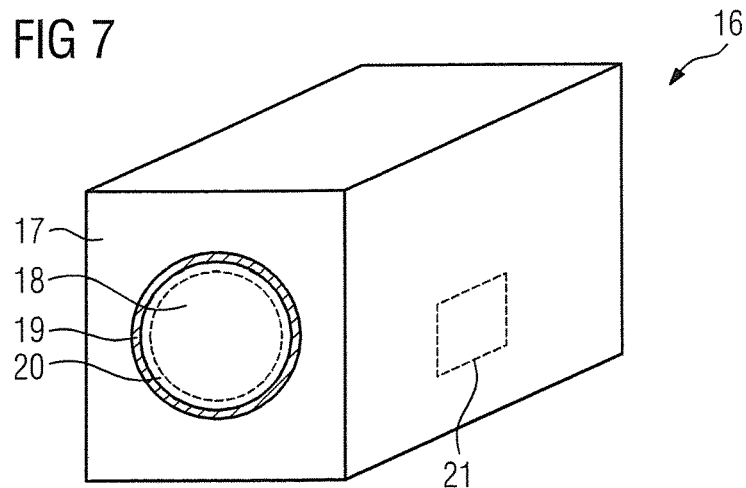
FIG. 7 shows a magnetic resonance device according to the invention.

FIG. 7 shows finally a basic illustration of a magnetic resonance apparatus 16 according to the invention. This has, as known in principle, a basic magnet unit 17 that includes the basic field magnet that produces the surrounding field and a patient reception unit 18 into which the object to be examined may be introduced. A gradient coil arrangement 19 and a radio-frequency coil arrangement 20 are provided surrounding the patient reception unit 18. Via a patient bed, not shown in more detail, a patient may be moved into the patient reception unit 18 in order to operate the magnetic resonance imaging.

The operation of the magnetic resonance device 16 is controlled by a control computer 21, which is also configured to carry out the method according to the invention. In the present exemplary embodiment it includes an acquisition trajectory generating unit that according to step S1, may randomly generate candidates for acquisition trajectories. In a testing unit according to step S2, the acquisition trajectory is tested for distribution criteria. An acquisition unit controls the remaining components of the magnetic resonance apparatus 16 according to the sequences assigned to the acquisition trajectory, such as the sequence shown in FIG. 3 with the gradient pulses 7. The control computer 21 may also include the evaluation unit in which the undersampled data, for example, may be enhanced by iterative reconstruction. To this end, the evaluation unit obtains from the acquisition unit information about which point in k-space are scanned and at which time, so that acquired magnetic resonance data may be assigned in practice. Part of the evaluation in the evaluation unit may also be the described movement correction.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring magnetic resonance (MR) data from an examination object comprising:

providing control signals that comprise an acquisition pulse sequence to an MR data acquisition unit from a computer, and operating said MR data acquisition unit, comprising a gradient system, while an examination object is situated in said MR data acquisition unit, to acquire MR data from the examination object using the control signals comprising the acquisition pulse sequence, including operating said gradient system with said control signals so as to generate a readout gradient in a readout direction and a plurality of phase coding gradient pulses in a phase coding direction that is perpendicular to said readout direction;

via said computer, entering the acquired MR data into an electronic memory organized as two dimensional k-space comprising a plurality of k-space lines proceeding in a k-space direction corresponding to said readout direction, by entering said MR data along a k-space trajectory that proceeds through respective data entry points in said k-space lines by undersampling at least some of said lines by entering said MR data into fewer than all of the data entry points respectively therein, and, in an acquisition section proceeding through an entirety of k-space in said k-space direction corresponding to said readout direction, implementing a plurality of jumps between respective k-space lines, in a k-space direction corresponding to said phase coding direction, said jumps being produced by said phase coding gradient pulses, said k-space direction corresponding to said readout direction being perpendicular to said k-space direction corresponding to said phase coding direction, thereby producing an undersampled data set in said memory organized as k-space; and making said undersampled data set available in electronic form as a data file from said electronic memory organized as k-space.

2. A method as claimed in claim 1 comprising activating said phase coding gradient pulses to cause said jumps to occur between adjacent k-space lines.

3. A method as claimed in claim 1 comprising selecting said k-space trajectory to cause, at least in a localized neighborhood of data entry points in k-space, a distribution of said data entry points to exceed a predetermined uniform distribution level.

4. A method as claimed in claim 1 comprising generating said k-space trajectory in said computer as a random k-space trajectory that causes said jumps to occur randomly in said random acquisition trajectory and, in said computer, automatically testing said random k-space trajectory against at least one distribution criterion, and using said random k-space trajectory to acquire said MR data from said examination object only when said testing shows that said random k-space trajectory fulfills said at least one distribution criterion.

5. A method as claimed in claim 4 comprising using a homogeneity criterion as said at least one distribution criterion, and, with said homogeneity criterion, testing whether said random k-space trajectory produces a distribution of data entry points in k-space into which said MR data are actually entered, dependent on a degree of said undersampling.

6. A method as claimed in claim 5 comprising selecting said homogeneity criterion to require a density distribution in k-space selected from the group consisting of a first density distribution comprising a density reducing radially from a center of k-space, and a second density distribution comprising a density that decreases along a line in said k-space direction corresponding to said phase coding direction, that includes a center of k-space.

7. A method as claimed in claim 5 wherein said first density distribution reduces radially from said center of k-space according to one divided a polynomial of a distance from the center of k-space, and wherein said second density distribution decreases along said line according to one divided by polynomial of a distance from the center of k-space along said k-space direction corresponding to the phase coding direction.

8. A method as claimed in claim 7 wherein said polynomial for each of said first and second density distributions is $r^n$, wherein r is a radial distance from the center of k-space or a distance along said line from the center of k-space in the k-space direction corresponding to the phase coding direction, and wherein n is in a range between one and three.

9. A method as claimed in claim 5 comprising testing the density distribution in k-space against said homogeneity criterion by dividing k-space into a plurality of segments, each of said segments having a density therein of data entry points in which said MR data are entered, and comparing the respective densities in said segments each with at least one reference value that is determined from said density distribution, and wherein said homogeneity criterion is considered as being fulfilled when the density in a respective segment does not deviate from said reference value by more than a predetermined deviation amount.

10. A method as claimed in claim 4 comprising using, as said distribution criterion, a neighborhood criterion that compares a number of data entry points respectively filled with said MR data in adjacent lines in k-space.

11. A method as claimed in claim 10 comprising requiring, for fulfillment of said neighborhood criteria, said number of data entry points in said adjacent lines that are filled with said MR data to deviate from each other by no more than a predetermined proportion.

12. A method as claimed in claim 11 comprising selecting said proportion from the group consisting of a range between 10% and 30%, and a proportion that is dependent on a degree of said undersampling.

13. A method as claimed in claim 4 comprising determining said random acquisition trajectory in said computer using a random walk algorithm.

14. A method as claimed in claim 1 comprising activating said phase coding gradient pulses to produce at least four of said jumps in each acquisition section.

15. A method as claimed in claim 1 comprising employing, as said acquisition trajectory, an acquisition trajectory that causes a line containing a center of k-space to be completely filled with said MR data at all data entry points of said line, or that causes a line closest to a center of k-space to be completely filled with said MR data at all data entry points of said line closest to said center.

16. A method as claimed in claim 1 comprising operating said MR data acquisition unit to acquire said undersampled data set in one of a plurality of chronologically successive acquisitions of MR data from said examination object and, in acquisitions of MR data other than said one of said acquisitions, acquiring said MR data from said examination object with a further undersampling by leaving random lines in k-space completely empty of MR data, each of said acquisitions with said further undersampling producing a respective further undersampled MR data set and providing said undersampled data set and said further undersampled data sets to an image reconstruction computer and, in said image reconstruction computer, reconstructing an image of said examination object from said undersampled data set and said further undersampled data sets, using time as a third dimension in addition to said readout direction and said phase coding direction.

17. A method as claimed in claim 1 comprising selecting said undersampling to produce an acceleration factor associated with the acquisition of said MR data in a range between 2 and 4.

18. A method as claimed in claim 1 comprising operating said MR data acquisition unit to activate, as said readout gradient, a readout gradient pulse during said acquisition section configured to reduce a bandwidth in a region of k-space closest to a center of k-space.

19. A method as claimed in claim 18 comprising reducing said bandwidth by reducing a gradient field strength of said readout gradient pulse.

20. A method as claimed in claim 1 comprising back-calculating MR data that is acquired during said jumps.

21. A method as claimed in claim 1 comprising calculating a phase difference for said MR data during jumps of a repeatedly acquired data entry point in k-space, and using the calculating of phase difference as an indicator of movement of said examination object.

22. A magnetic resonance (MR) apparatus comprising:

an MR data acquisition unit comprising a gradient system;

an electronic memory organized as two-dimensional k-space comprising a plurality of k-space lines proceeding in a k-space direction corresponding to said readout direction;

a control computer configured to provide control signals that comprise an acquisition pulse sequence to said MR data acquisition unit from a computer, and to operate the MR data acquisition unit, while an examination object is situated in said MR data acquisition unit, to acquire MR data from the examination object using the control signals comprising the acquisition pulse sequence operating said gradient system with said control signals so as to generate a readout gradient in a readout direction and a plurality of phase coding gradient pulses in a phase coding direction that is perpendicular to said readout direction;

said control computer being configured to enter the acquired MR data into said electronic memory by entering said MR data along a k-space trajectory that proceeds through respective data entry points in said k-space lines by undersampling at least some of said lines by entering said MR data into fewer than all of the data entry points respectively therein, and, in an acquisition section proceeding through an entirety of k-space in said k-space direction corresponding to said readout direction, to implement a plurality of jumps between respective k-space lines, in a k-space direction corresponding to said phase coding direction, said jumps being produced by said phase coding gradient pulses, said k-space direction corresponding to said readout direction being perpendicular to said k-space direction corresponding to said phase coding direction, thereby producing an undersampled data set in said memory organized as k-space; and said control computer being configured to make said undersampled data set available in electronic form as a data file from said electronic memory organized as k-space.

\* \* \* \* \*